(12) United States Patent
Chen et al.

(10) Patent No.: US 7,471,117 B2
(45) Date of Patent: Dec. 30, 2008

(54) CIRCUIT FOR DETECTING MAXIMAL FREQUENCY OF PULSE FREQUENCY MODULATION AND METHOD THEREOF

(75) Inventors: Li Chieh Chen, Hsinchu (TW); Yu Min Sun, Hsinchu (TW); Chu Yu Chu, Hsinchu (TW)

(73) Assignee: Advanced Analog Technology, Inc. (TW)

( * ) Notice: Subject to any disclaimer, the term of this patent is extended or adjusted under 35 U.S.C. 154(b) by 106 days.

(21) Appl. No.: 11/725,440

(22) Filed: Mar. 20, 2007

(65) Prior Publication Data

US 2008/0197885 A1 Aug. 21, 2008

(30) Foreign Application Priority Data

Feb. 15, 2007 (TW) .............................. 96105624 A

(51) Int. Cl.
*H03D 3/00* (2006.01)
*H03K 9/06* (2006.01)

(52) U.S. Cl. .......................................... 327/47; 327/49

(58) Field of Classification Search .................. 327/47, 327/49
See application file for complete search history.

(56) References Cited

U.S. PATENT DOCUMENTS 6,278,301 B1 * 8/2001 Jones et al. .................. 327/132
7,183,810 B2 * 2/2007 Park .............................. 327/2
7,259,595 B2 * 8/2007 Kim .............................. 327/39

* cited by examiner

*Primary Examiner*—Tuan T Lam
(74) *Attorney, Agent, or Firm*—Oliff & Berridge, PLC

(57) ABSTRACT

The circuit for detecting the maximal frequency of the pulse frequency modulation includes an oscillator-controlling unit, a delay circuit and a master-slave register. The oscillator-controlling unit is connected to an oscillator, which generates the pulse frequency modulation signals, and includes a first-half pulse-generating module and a second-half pulse-generating module. The delay circuit is connected to the second-half pulse-generating module. The master-slave register includes a clock, an input end and an output end, wherein the input end is connected to the oscillator-controlling unit, and the clock is connected to the delay circuit.

7 Claims, 4 Drawing Sheets

CIRCUIT FOR DETECTING MAXIMAL FREQUENCY OF PULSE FREQUENCY MODULATION AND METHOD THEREOF

BACKGROUND OF THE INVENTION

1. Field of the Invention

The present invention relates to a detecting circuit and method for pulse frequency modulation, and more particularly, to a circuit and method for detecting the maximal frequency of the pulse frequency modulation.

2. Description of the Related Art

FIG. 1 is a hint diagram of a prior art pulse frequency modulation. The frequency of a prior art pulse frequency modulation is determined by its workload. The heavier the workload is, the higher the operating frequency will be. In FIG. 1, $T_{ON}$ represents the pulse width of the pulse frequency modulation signals, and $T_{OFF}$ represents intervals between the pulse frequency modulation signals. The smaller the parameter $T_{OFF}$ is, the higher the operating frequency will be.

FIG. 2 is an enlarged diagram of a prior art pulse frequency modulation. In practical applications, the pulse frequency modulation signals generated by the oscillator are usually triangle waves, while the $T_{ON}$ pulses shown in FIG. 1 are only the first-half cycles of the pulse frequency modulation signals. If $T_{OFF}$ is equal or close to zero, it represents the fact that the maximal frequency of the pulse frequency modulation signals has appeared already, and at this moment the pulse frequency modulation signals are in a continuous state.

For some applications, the pulse frequency modulation signals at the position of the maximal frequency have a very high utilization value. Therefore, the method needed to detect if the maximal frequency already appeared is an important issue.

SUMMARY OF THE INVENTION

The circuit and method for detecting the maximal frequency of the pulse frequency modulation of the present invention are for use in effectively determining whether the maximal frequency of the pulse frequency modulation already appeared.

The first embodiment of the present invention comprises an oscillation control unit, a delay circuit, an inverter, a first latch and a second latch. The oscillation control unit is connected to an oscillator for generating the pulse frequency modulation. The oscillation control unit includes a first-half-cycle pulse-generating module and a second-half-cycle pulse-generating module. The delay circuit is connected to the second-half-cycle pulse-generating module. The inverter is connected to the delay circuit. The first latch has a clock, an input end and an output end. The input end connects to the first-half-cycle pulse-generating module, and the clock connects to the delay circuit. The second latch has a clock, an input end and an output end. The input end connects to the output end of the first latch, and the clock connects to the output of the inverter.

The second embodiment of the present invention comprises an oscillation control unit, a delay circuit, an inverter and a master-slave latch. The oscillation control unit is connected to an oscillator for generating the pulse frequency modulation. The oscillation control unit includes a first-half-cycle pulse-generating module and a second-half-cycle pulse-generating module. The delay circuit is connected to the second-half-cycle pulse-generating module. The master-slave latch has a clock, an input end and an output end. The input end connects to the oscillation control unit, and the clock connects to the delay circuit.

The present invention discloses a method for detecting the maximal frequency of the pulse frequency modulation. The method comprises the following steps: (a) generating first-half-cycle pulses and second-half-cycle pulses according to the pulse frequency modulation; (b) delaying a time period for the second-half-cycle pulse; and (c) determining the maximal frequency of the pulse frequency modulation that appears if the first-half-cycle pulse remains in a logic-high state during the falling edge of the delayed second-half-cycle pulse.

BRIEF DESCRIPTION OF THE DRAWINGS

The invention will be described according to the appended drawings in which.

PREFERRED EMBODIMENT OF THE PRESENT INVENTION

Figure 1:
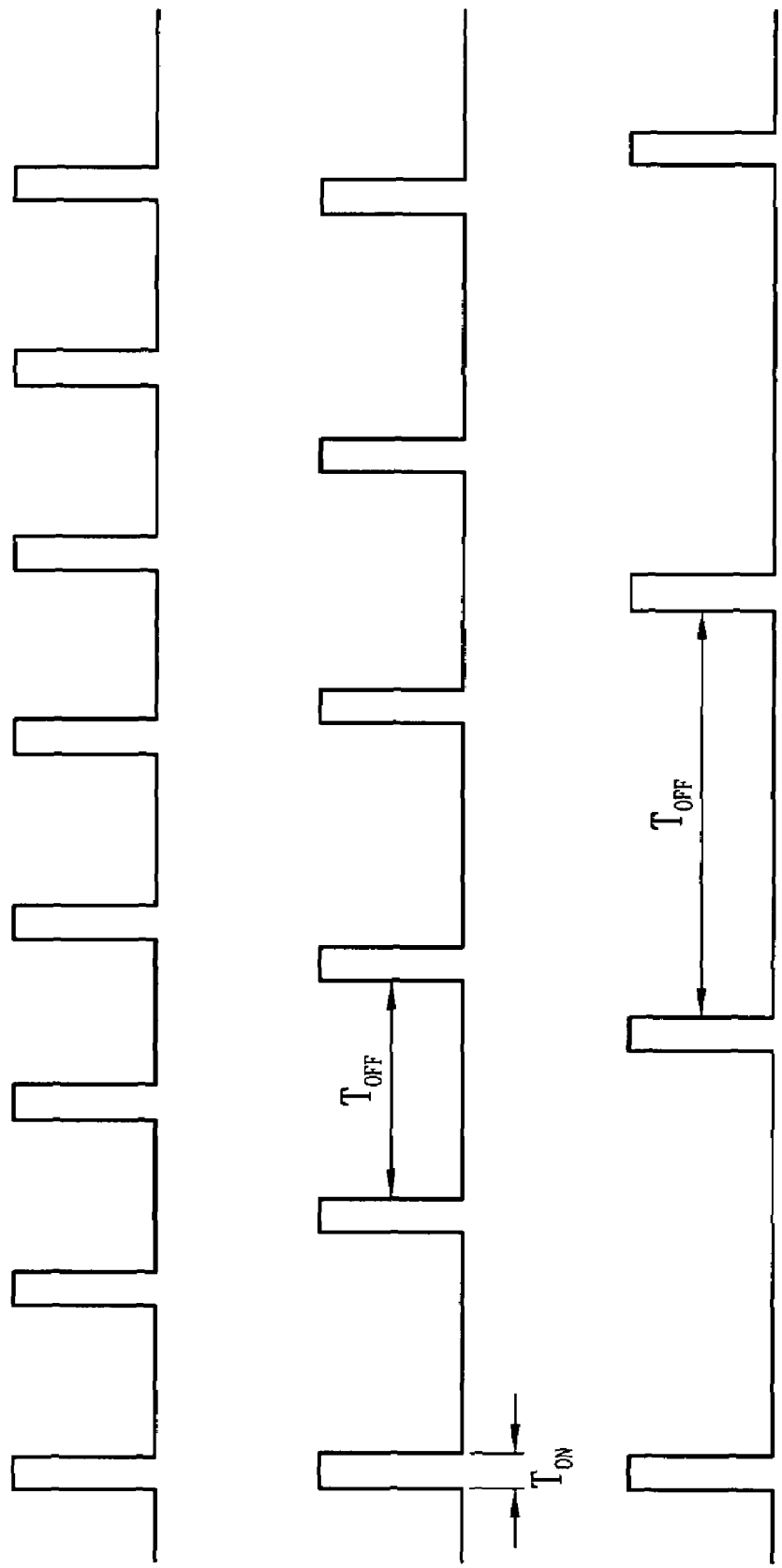
FIG. 1 is a hint diagram of a prior art pulse frequency modulation.
Figure 2:
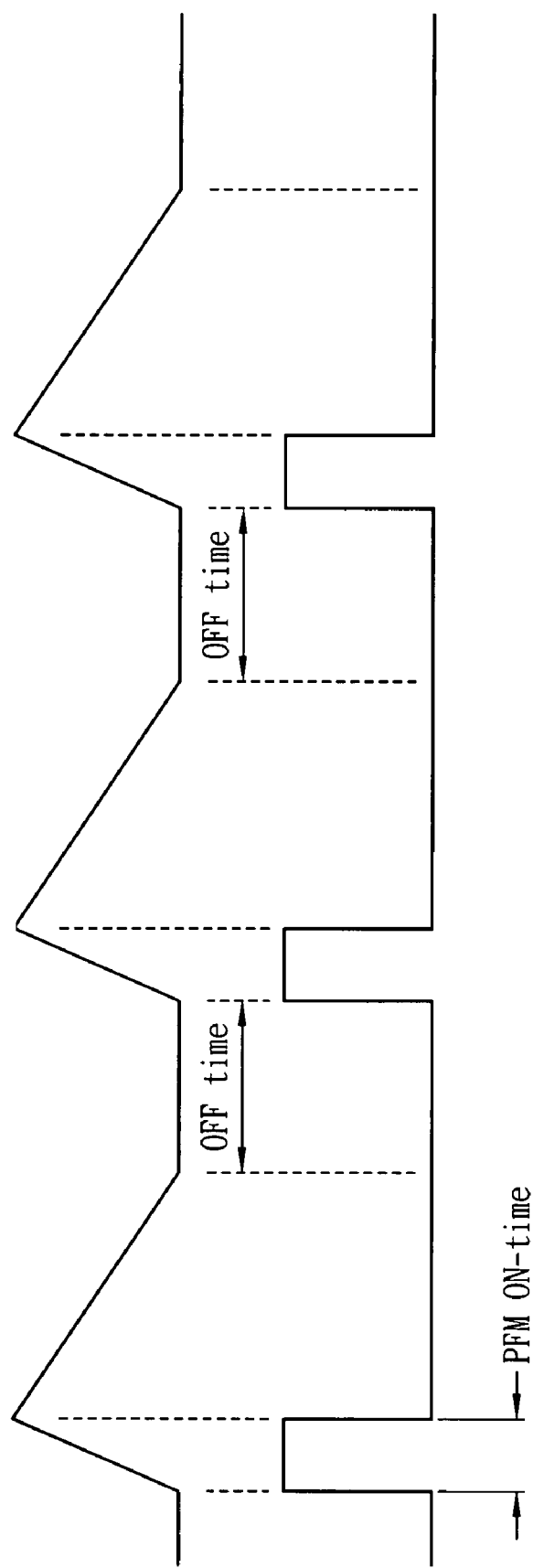
FIG. 2 is an enlarged diagram of a prior art pulse frequency modulation.
Figure 3:
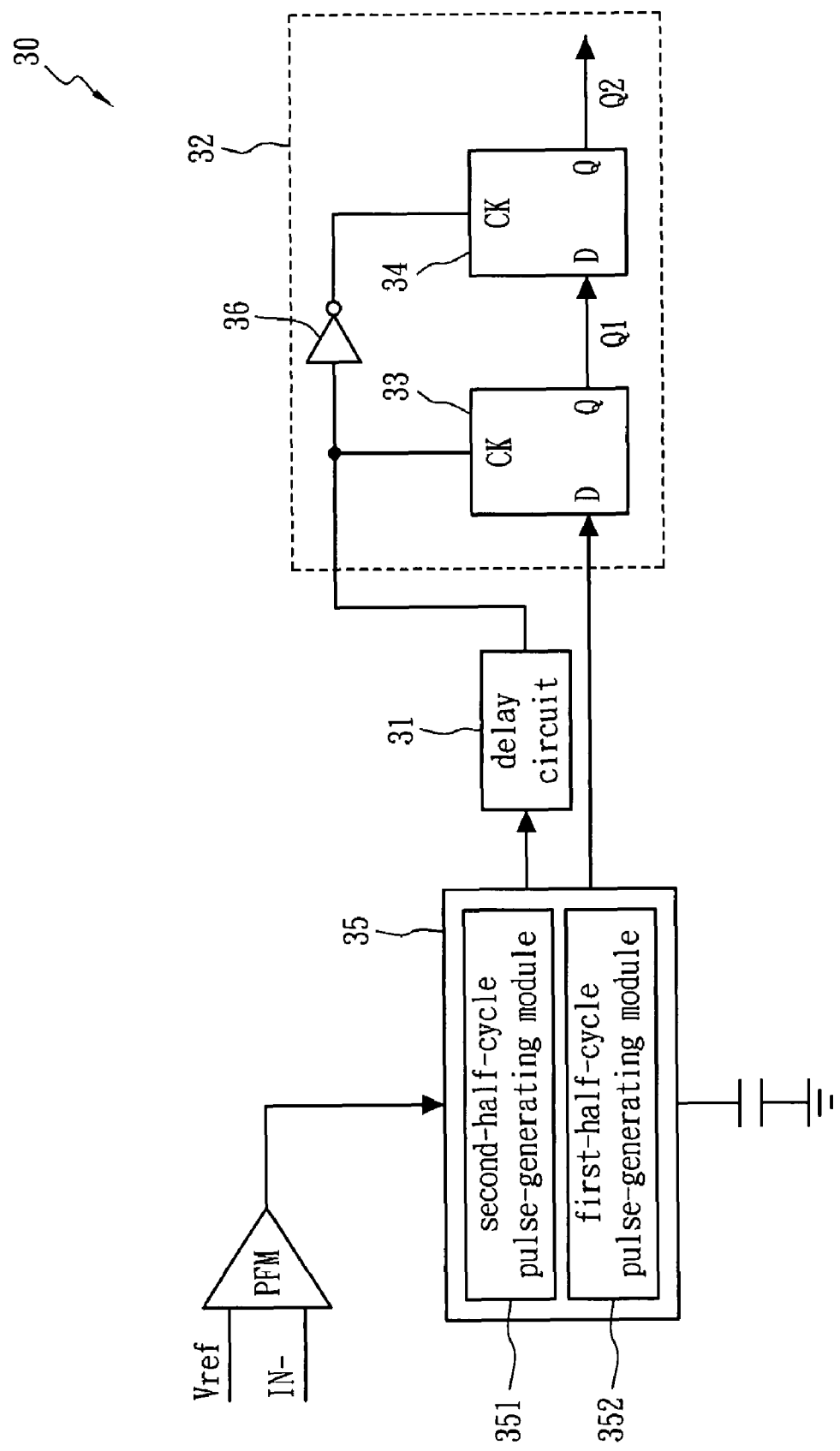
FIG. 3 is a circuit for detecting the maximal frequency according to an embodiment of the present invention.

FIG. 3 is a circuit for detecting the maximal frequency according to an embodiment of the present invention. The circuit 30 comprises an oscillation control unit 35, a delay circuit 31, an inverter 36, a first latch 33 and a second latch 34. The oscillation control unit 35 receives triangle-wave pulse frequency modulation signals generated by an oscillator, and uses a first-half-cycle pulse-generating module 351 and a second-half-cycle pulse-generating module 352 therein to generate first-half-cycle pulses and second-half-cycle pulses, respectively. The delay circuit 31 is for use in delaying a time period for the second-half-cycle pulses. The delay time of the delay circuit 31 could be set up within a tolerance of the maximal frequency. The output of the delay circuit 31 and the output of the inverter 36 act as clock inputs for the first latch 33 and the second latch 34. The input end of the first latch 33 connects to the first-half-cycle pulse-generating module 352, and the input end of the second latch 34 connects to the output end of the first latch 33. On the other hand, a standard master-slave register 32 can be used in place of the first latch 33, the second latch 34 and the inverter 36, or a circuit with the same function but different structure can be used in place of the same. The present invention is not limited to any specific structure of the substitute.

Figure 4:
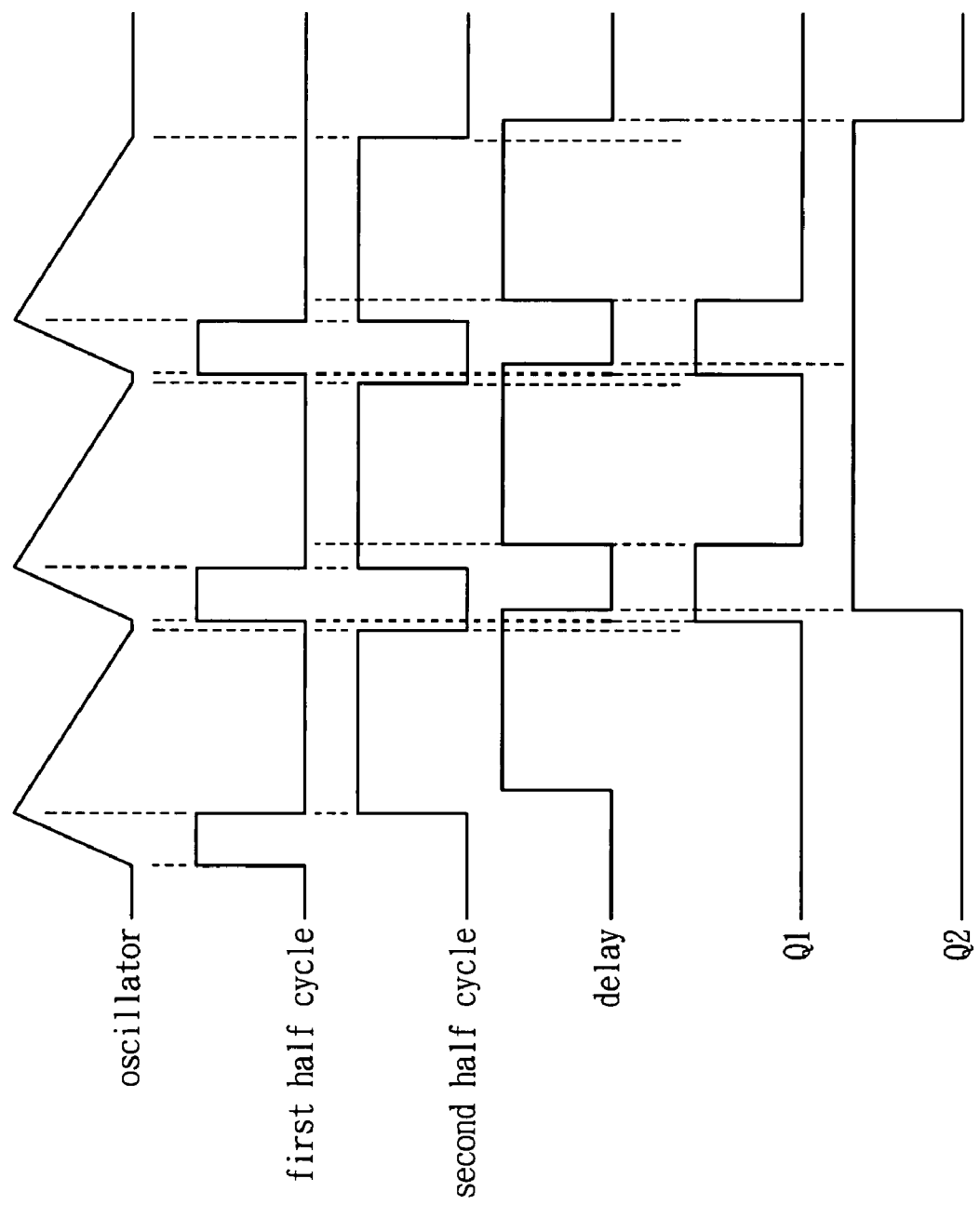
FIG. 4 is a timing diagram of the method for detecting the maximal frequency according to an embodiment of the present invention.

FIG. 4 is a timing diagram of the method for detecting the maximal frequency according to an embodiment of the present invention. First of all, an oscillator generates a series of triangle-wave pulse frequency modulation signals, by which the oscillation control unit 35 generates first-half-cycle pulses and second-half-cycle pulses. The delay circuit 31 is for use in delaying the second-half-cycle pulses for a time period. Because the first-half-cycle pulse remains in a logic-high state during the falling edge of the delayed second-half-cycle pulses, the output end Q1 of the first latch 33 changes its state from logic low into logic high. Thereafter, the output Q2 of the second latch 34 captures the output Q1 of the first latch 33 and remains in a logic-high state until the pulse frequency modulation signals no longer remain in the maximal frequency. In other words, if the delay time is set up within the tolerance of the maximal frequency, by means of observing if the output Q2 of the second latch 34 still stays in a logic-high state, whether the maximal frequency of the pulse frequency modulation signals already appeared is thereby determined.

The above-described embodiments of the present invention are intended to be illustrative only. Numerous alternative embodiments may be devised by persons skilled in the art without departing from the scope of the following claims.

What is claimed is:

1. A circuit for detecting the maximal frequency of a pulse frequency modulation, comprising:
    an oscillation control unit connected to an oscillator for generating the pulse frequency modulation, the oscillation control unit including a first-half-cycle pulse-generating module and a second-half-cycle pulse-generating module;
    a delay circuit connected to the second-half-cycle pulse-generating module;
    an inverter connected to the delay circuit;
    a first latch having a clock, an input end and an output end, wherein the input end connects to the first-half-cycle pulse-generating module, and the clock connects to the delay circuit; and
    a second latch having a clock, an input end and an output end, wherein the input end connects to the output end of the first latch, and the clock connects to the output of the inverter.

2. The circuit for detecting the maximal frequency of the pulse frequency modulation of claim 1, wherein the delay time of the delay circuit is set up within the tolerance of the maximal frequency.

3. A circuit for detecting the maximal frequency of a pulse frequency modulation, comprising:
    an oscillation control unit connected to an oscillator for generating the pulse frequency modulation, the oscillation control unit including a first-half-cycle pulse-generating module and a second-half-cycle pulse-generating module;
    a delay circuit connected to the second-half-cycle pulse-generating module; and
    a master-slave register having a clock, an input end and an output end, wherein the input end connects to the oscillation control unit, and the clock connects to the delay circuit.

4. The circuit for detecting the maximal frequency of the pulse frequency modulation of claim 3, wherein the delay time of the delay circuit is set up within the tolerance of the maximal frequency.

5. A method for detecting the maximal frequency of a pulse frequency modulation, comprising the steps of:
    generating first-half-cycle pulses and second-half-cycle pulses according to the pulse frequency modulation;
    delaying a time period for the second-half-cycle pulse; and
    determining that the maximal frequency of the pulse frequency modulation appears when the first-half-cycle pulse remains in a logic-high state during the falling edge of the delayed second-half-cycle pulse.

6. The method for detecting the maximal frequency of the pulse frequency modulation of claim 5, wherein the delay time is set up within the tolerance of the maximal frequency.

7. The method for detecting the maximal frequency of the pulse frequency modulation of claim 5, further comprising the step of:
    determining that the maximal frequency of the pulse frequency modulation disappears when the first-half-cycle pulse is not in a logic-high state during the falling edge of the delayed second-half-cycle pulse.

* * * * *